US00RE43514E

(19) United States
(12) Reissued Patent
Haikonen

(10) Patent Number: US RE43,514 E
(45) Date of Reissued Patent: Jul. 17, 2012

(54) CIRCUIT ELEMENTS AND PARALLEL COMPUTATIONAL NETWORKS WITH LOGICALLY ENTANGLED TERMINALS

(75) Inventor: Pentti Haikonen, Helsinki (FI)

(73) Assignee: Intellectual Ventures I LLC, Wilmington, DE (US)

(21) Appl. No.: 12/349,989

(22) Filed: Jan. 7, 2009

Related U.S. Patent Documents

Reissue of:

(64) Patent No.: 7,161,385
Issued: Jan. 9, 2007
Appl. No.: 10/803,094
Filed: Mar. 18, 2004

(51) Int. Cl.
*H03K 19/02* (2006.01)
*H03K 19/003* (2006.01)

(52) U.S. Cl. ..... 326/56; 326/21; 326/136

(58) Field of Classification Search ..... 326/56, 326/21, 136

See application file for complete search history.

(56) References Cited

U.S. PATENT DOCUMENTS

| | | | | |
|---|---|---|---|---|
| 5,251,305 | A * | 10/1993 | Murphy et al. | 713/501 |
| 5,734,581 | A | 3/1998 | Butts et al. | |
| 5,767,701 | A * | 6/1998 | Choy et al. | 326/93 |
| 5,789,944 | A | 8/1998 | Choy et al. | |
| 6,154,050 | A | 11/2000 | Ma et al. | |
| 6,567,871 | B2 * | 5/2003 | Koh et al. | 710/110 |
| 6,686,767 | B1 | 2/2004 | Wasson | |
| 6,922,665 | B1 | 7/2005 | Guccione et al. | |

* cited by examiner

*Primary Examiner* — James H Cho

(57) ABSTRACT

The invention relates to circuit elements and computing networks for resolving logical entanglement, in which the allowed logical value of a variable in a set of variables depends on the logical values of the other variables in the set. A circuit element according to the invention comprises two or more logically entangled bi-directional terminals, wherein each bi-directional terminal can assume any one of three logical states, which are a logical true state, a logical false state, and an indefinite state, in which state the bi-directional terminal accepts one of the logical true and logical false states as an external input from an external source. An entanglement logic resolves the logical state of the bi-directional terminals according to a predetermined set of logical entanglement rules between the bi-directional terminals.

21 Claims, 7 Drawing Sheets

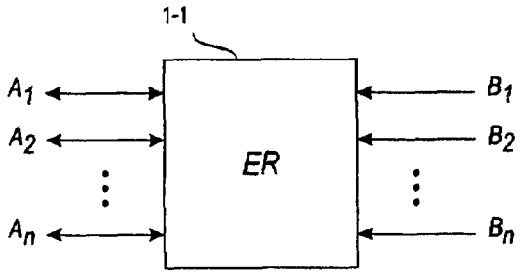
Fig. 1
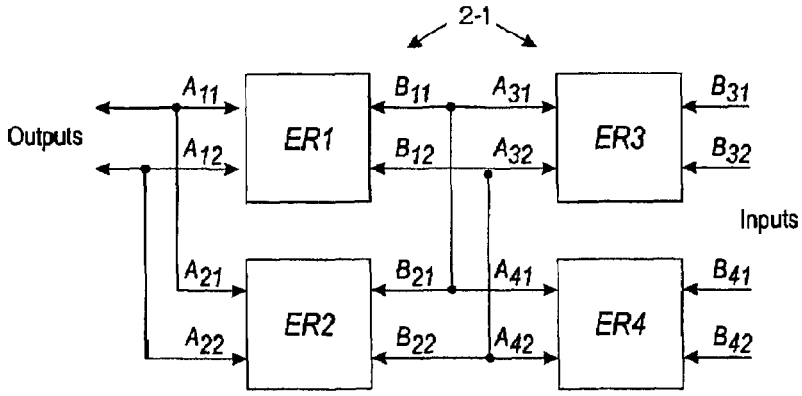
Fig. 2
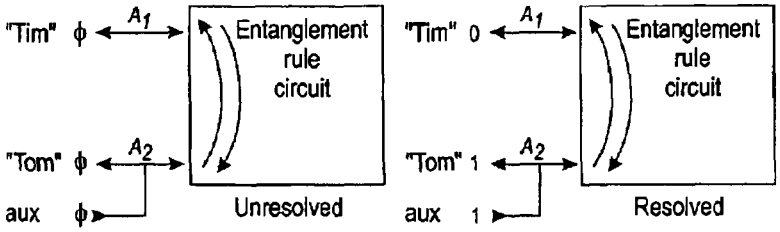
Fig. 3A
ϕ = Indefinite
Fig. 3B
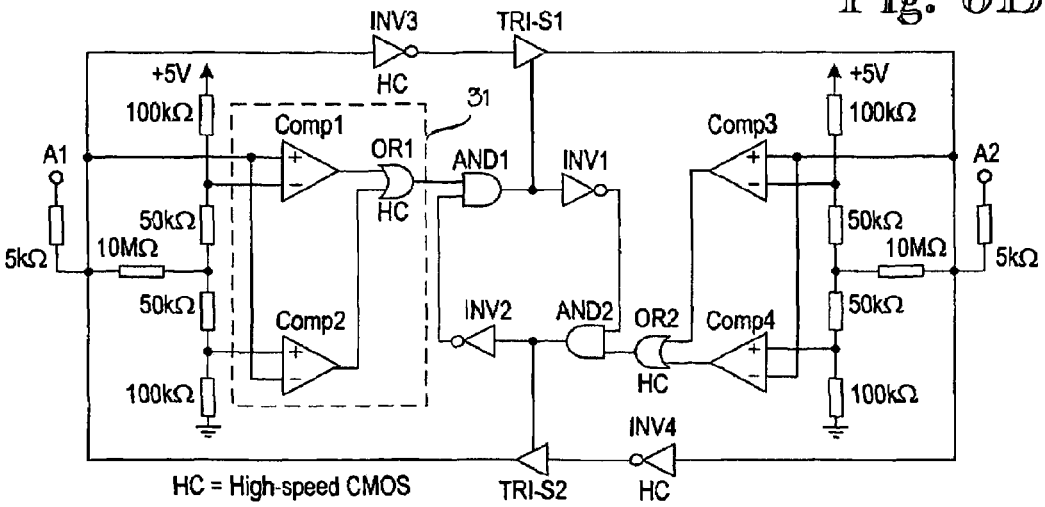

| In | Out |
|---|---|
| 0 | 1 |
| 1 | 0 |

45

| A | B | C |
|---|---|---|
| 0 | 0 | 0 |
| 0 | 1 | 0 |
| 1 | 0 | 0 |
| 1 | 1 | 1 |

55

| C | A | B |
|---|---|---|
| 0 | ϕ | ϕ |
| 1 | 1 | 1 |

65

66

$A=1 \rightarrow B=0$ $B=1 \rightarrow A=0$

| A | B | S | $C_o$ |
|---|---|---|---|
| 0 | 0 | 0 | 0 |
| 0 | 1 | 1 | 0 |
| 1 | 0 | 1 | 0 |
| 1 | 1 | 0 | 1 |

76

| S | $C_o$ | A | B |
|---|---|---|---|
| 0 | 0 | 0 | 0 |
| 1 | 0 | 0 | 1 |
| 1 | 0 | 1 | 0 |
| 0 | 1 | 1 | 1 |

87

88 $S=0$ & $C_o=0 \rightarrow A=B=0$ $S=0$ & $C_o=1 \rightarrow A=B=1$ 89 if $S=1$ & $C_o=0$ then:

if $A=1$ then $B=0$ if $B=1$ then $A=0$

97

| A | B | $C_I$ | S | $C_O$ |
|---|---|---|---|---|
| 0 | 0 | 0 | 0 | 0 |
| 0 | 1 | 0 | 1 | 0 |
| 1 | 0 | 0 | 1 | 0 |
| 1 | 1 | 0 | 0 | 1 |
| 0 | 0 | 1 | 1 | 0 |
| 0 | 1 | 1 | 0 | 1 |
| 1 | 0 | 1 | 0 | 1 |
| 1 | 1 | 1 | 1 | 1 |

107

| S | $C_O$ | A | B | $C_I$ |
|---|---|---|---|---|
| 0 | 0 | 0 | 0 | 0 |
| 1 | 0 | 0 | 1 | 0 |
| 1 | 0 | 1 | 0 | 0 |
| 1 | 0 | 0 | 0 | 1 |
| 0 | 1 | 1 | 1 | 0 |
| 0 | 1 | 0 | 1 | 1 |
| 0 | 1 | 1 | 0 | 1 |
| 1 | 1 | 1 | 1 | 1 |

108 $\begin{cases} S=0 \ \& \ C_O=0 \rightarrow A=B=C_I=0 \\ S=1 \ \& \ C_O=1 \rightarrow A=B=C_I=1 \end{cases}$

109 if $S=1$ & $C_O=0$ then:

- if $A=1$ then $B=C_I=0$
- if $B=1$ then $A=C_I=0$
- if $C_I=1$ then $A=B=0$ if $S=0$ & $C_O=1$ then:

- if $A=0$ then $B=C_I=1$
- if $B=0$ then $A=C_I=1$
- if $C_I=0$ then $A=B=1$

| | | | | | |
|---|---|---|---|---|---|
| | | | a2 | a1 | a0 |
| x | | | | b1 | b0 |
| | | | a2b0 | a1b0 | a0b0 |
| + | | a2b1 | a1b1 | a0b1 | |
| + | c2 | c1 | c0 | | |
| | p4 | p3 | p2 | p1 | p0 |

128

| | $p_4$ | $p_3$ | $p_2$ | $p_1$ | $p_0$ |
|---|---|---|---|---|---|
| Input | 0 | 1 | 0 | 1 | 0 |

| | $bi_0$ | $bi_1$ | $bi_2$ | $bi_3$ | $bi_4$ | $bi_5$ | $bi_6$ |
|---|---|---|---|---|---|---|---|
| Bias | - | 1 | - | - | 1 | - | 1 |
| State | 0 | 1 | 0 | 0 | 0 | 0 | 1 |

| | $a_2$ | $a_1$ | $a_0$ | $b_1$ | $b_0$ |
|---|---|---|---|---|---|
| Result | 1 | 0 | 1 | 1 | 0 |

Fig. 13

130

| no | p4 | p3 | p2 | p1 | p0 | a2 | a1 | a0 | b1 | b0 | Result | Comment |
|---|---|---|---|---|---|---|---|---|---|---|---|---|
| 0 | 0 | 0 | 0 | 0 | 0 | 0 | 0 | 0 | 0 | 0 | 0x0 | Ok |
| 1 | 0 | 0 | 0 | 0 | 1 | 0 | 0 | 1 | 0 | 1 | 1x1 | Ok |
| 2 | 0 | 0 | 0 | 1 | 0 | 0 | 0 | 1 | 1 | 0 | 1x2 | Ok |
| 3 | 0 | 0 | 0 | 1 | 1 | 0 | 0 | 1 | 1 | 1 | 1x3 | Ok |
| 4 | 0 | 0 | 1 | 0 | 0 | 0 | 1 | 0 | 1 | 0 | 2x2 | Ok |
| 5 | 0 | 0 | 1 | 0 | 1 | 0 | 1 | 1 | 1 | 1 | - | False |
| 6 | 0 | 0 | 1 | 1 | 0 | 0 | 1 | 1 | 1 | 0 | 3x2 | Ok |
| 7 | 0 | 0 | 1 | 1 | 1 | 0 | 1 | 1 | 1 | 1 | - | False |
| 8 | 0 | 1 | 0 | 0 | 0 | 1 | 0 | 0 | 1 | 0 | 4x2 | Ok |
| 9 | 0 | 1 | 0 | 0 | 1 | 1 | 0 | 1 | 1 | 1 | - | False |
| 10 | 0 | 1 | 0 | 1 | 0 | 1 | 0 | 1 | 1 | 0 | 5x2 | Ok |
| 11 | 0 | 1 | 0 | 1 | 1 | 1 | 0 | 1 | 1 | 1 | - | Overflow |
| 12 | 0 | 1 | 1 | 0 | 0 | 1 | 1 | 0 | 1 | 0 | 6x2 | Ok |
| 13 | 0 | 1 | 1 | 0 | 1 | 1 | 0 | 1 | 1 | 1 | - | Overflow |
| 14 | 0 | 1 | 1 | 1 | 0 | 1 | 1 | 1 | 1 | 0 | 7x2 | Ok |
| 15 | 0 | 1 | 1 | 1 | 1 | 1 | 1 | 1 | 1 | 0 | - | False |
| 16 | 1 | 0 | 0 | 0 | 0 | 0 | 1 | 1 | 1 | 0 | - | Overflow |
| 17 | 1 | 0 | 0 | 0 | 1 | 1 | 1 | 1 | 0 | 1 | - | Overflow |
| 18 | 1 | 0 | 0 | 1 | 0 | 1 | 1 | 1 | 0 | 1 | - | False |
| 19 | 1 | 0 | 0 | 1 | 1 | 1 | 1 | 1 | 1 | 1 | - | Overflow |
| 20 | 1 | 0 | 1 | 0 | 0 | 1 | 1 | 1 | 1 | 1 | - | Overflow |
| 21 | 1 | 0 | 1 | 0 | 1 | 1 | 1 | 1 | 1 | 1 | 7x3 | Ok |

CIRCUIT ELEMENTS AND PARALLEL COMPUTATIONAL NETWORKS WITH LOGICALLY ENTANGLED TERMINALS

Matter enclosed in heavy brackets [ ] appears in the original patent but forms no part of this reissue specification; matter printed in italics indicates the additions made by reissue.

*CROSS-REFERENCE TO RELATED APPLICATIONS*

*This application is a Reissue application of U.S. Ser. No. 10/803,094, filed Mar. 18, 2004, now U.S. Pat. No. 7,161,385, granted Jan. 9, 2007.*

BACKGROUND OF THE INVENTION

The invention relates to parallel computational networks and circuit elements for such networks. The invention can be used in several applications in which variable values are connected by logical rules, including but not limited to applications in which the object is to perform reverse calculations, ie, calculations in which a result is known but the object is to find a set of starting values that gives the known result. There are several mathematical or logical operations which are grossly asymmetrical, which means that it is a straightforward task to carry out the operation in one direction but no fast algorithms are known or even supposed to exist for the reverse calculation.

BRIEF DESCRIPTION OF THE INVENTION

An object of the present invention is to provide a circuit element and a parallel computational network that facilitate performing such operations. The object of the invention is achieved by the methods and equipment which are characterized by what is stated in the independent claims. Preferred embodiments of the invention are disclosed in the dependent claims.

In order to provide a concrete but non-limiting example, the invention is first described in the context of reverse computation. In forward computation, a given set of input variables produces a definite set of output variables. But with reverse computation a set of given output variables is not always sufficient to determine a corresponding set of input variables. A simple example is the exclusive or operation, or XOR: C=A XOR B. As is well known, C is true if and only if precisely one of the input variables A and B is true. For any set of input variables A and B, the output variable C can be determined, but the reverse is not true: a given value of C is not sufficient in itself to determine the values of A and B. For instance, if C is true then either A is true and B false or B is true and A is false. In this way both A and B may have the values of true and false and are thus in an indefinite state. However, these states are logically entangled; as soon as the value of A or B is fixed the value of the other is fixed, too. If the value of A is set to be true then B must be false and vice versa, and no degrees of freedom remain. Thus the A and B variables of a reverse-XOR element are logically entangled.

Thus an aspect of the invention is a circuit element capable of sustaining and processing a set of logically entangled variables with indefinite states. Another aspect of the invention is a parallel computational network that employs these inventive circuit elements. Yet another aspect is computer software whose execution in a computer creates the inventive circuit elements and parallel computational networks by computer simulation.

A key concept underlying the present invention is the logical entanglement. The entanglement, as used herein, means that the allowed logical value of a variable in a set of two or more variables depends on the logical values of the other variables in the set. For example: Let there be a number of logical variables $A_i$ that may have two different values: 1 (logical true) and 0 (logical false). Let the value of each $A_i$ be related to other $A_j$:s by a given logical rule $f_i$:

$$A_i=f_i(A_1, A_2, \ldots, A_j)$$

The rule $f_i$ defines the logical entanglement between the variables $A_i$. The simplest rule is the exclusion between two variables $A_1$ and $A_2$:

$$\text{EITHER } A_1 \text{ OR } A_2=1;\ A_1 \neq A_2$$

The exclusion rule means that if $A_1$ is given the value 1 then $A_2$ must be 0 and vice versa, because they both cannot have the value 1 or 0 at the same time. The true value of one variable excludes the true value of the other one and the false value of one variable excludes the false value of the other one, this is forced by the logical entanglement.

Instead of one fixed rule, a more complicated deduction may require several sets of rules between the logical variables. Let there be a number of rules $f_i$ that can be chosen by a number of other logical variables $B_i$:

$$f_i=g(B_1, B_2, \ldots, B_i)$$

Here g is the rule that gives the rule $f_i$ when the variables $B_i$ are given.

An aspect of the invention is a circuit element that implements these principles. The circuit realizes the abovementioned rules f and g. The element's A variable inputs $A_1$ to $A_n$ are bi-directional and may function as inputs as well as outputs. The circuit's B inputs $B_1$ to $B_n$ that select the f rule via the g rule are unidirectional and operate as inputs only. There may be two or more A inputs and zero or more B inputs. If the number of B inputs is zero, no B inputs exist and there will be only one f rule available in the circuit.

In practical applications several of the above circuits are assembled in a network in which a number of the A variable inputs are tied to other A inputs and B inputs. This presents a problem; the A inputs also operate as outputs and according to normal circuit practice, the outputs of logical circuits should not be tied together as the competition of high and low levels may occur, which may result in the destruction of the connected circuits. Therefore the actual circuitry must be designed in a special way that solves this problem. Likewise, when we consider the previous example of the exclusion between two variables $A_1$ and $A_2$ (either $A_1$ or $A_2$=1; $A_1 \neq A_2$), we will notice that as soon as $A_1$ or $A_2$ is defined, the other one will be defined too, but if neither is defined then neither may take the value of 1 or 0. This means that at that moment both $A_1$ and $A_2$ must remain at an indefinite state that is not 1 or 0. Such a state can be considered as a superimposition of the states 1 and 0. This state will not output 1 or 0 value, but will accept either one of those values as input and consequently set itself to this input value and will thereafter resolve the remaining entangled variables according to the given rule.

Thus a first aspect of the invention is a logic element or component that permits logical deduction as described above. The circuit element comprises:

two or more logically entangled bi-directional terminals, wherein each bi-directional terminal can assume any one of three logical states, which are:

(a) a logical true state;

(b) a logical false state; and (c) an indefinite state, in which state the bi-directional terminal accepts one of the logical true and logical false states as an external input from an external source; and an entanglement logic for resolving the logical state of each of the bi-directional terminals according to a predetermined set of logical entanglement rules between the bi-directional terminals.

A second aspect of the invention is a parallel computing network that comprises:

two or more circuit elements, each of which comprises:

two or more logically entangled bi-directional terminals, wherein each bi-directional terminal can assume any one of three logical states, which are:

(a) a logical true state;

(b) a logical false state; and (c) an indefinite state, in which state the bi-directional terminal accepts one of the logical true and logical false states as an external input from an external source; and an entanglement logic for resolving the logical state of each of the bi-directional terminals according to a predetermined set of logical entanglement rules between the bi-directional terminals;

wherein the network further comprises a set of additional terminals, each additional terminal accepting a logical true state or logical false state as an input, wherein the inputs to the set of additional terminals collectively determine which of several sets of logical entanglement rules are to be used for said resolving.

A third aspect of the invention is a computer program product that comprises computer program code for implementing the first and/or second aspects of the invention via computer simulation.

BRIEF DESCRIPTION OF THE DRAWINGS

In the following the invention will be described in greater detail by means of preferred embodiments with reference to the attached drawings, in which:

FIG. 1 generally depicts a logical circuit;

FIG. 2 shows a network that consists of a matrix of circuits shown in FIG. 1;

FIG. 3A illustrates logical entanglement in the context of a simple example;

FIG. 3B shows an example of a physical circuit for implementing the logical entanglement shown in FIG. 3A;

FIG. 13 shows a table that enumerates the results of factoring all numbers up to 21 in a circuit as shown in FIG. 12;

DETAILED DESCRIPTION OF THE INVENTION

Figure 4:
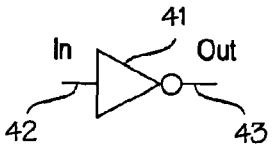
FIG. 4 shows a NOT element and its truth table.

FIG. 1 shows a circuit 1-1 that implements the logical principles described above. The circuit 1-1 realizes the above-mentioned rules f and g. The A variable inputs $A_1$ to $A_n$ are bi-directional and may function as inputs as well as outputs. The B inputs $B_1$ to $B_n$ that select the f rule via the g rule are unidirectional and operate as inputs only. There may be two or more A inputs and zero or more B inputs. If the number of B inputs is zero, no B inputs exist and there will be only one f rule available in the circuit.

FIG. 2 shows a network 2-1 that consists of a matrix of circuits 1-1 shown in FIG. 1. In the network 2-1 a number of A variable inputs are tied to other A inputs and B inputs. This presents a problem; the A inputs operate also as outputs and according to normal circuit practice, outputs of a circuit should not be tied together. Therefore the actual circuitry must be designed in a special way that allows this. Likewise, when we consider the previous example of the exclusion between two variables $A_1$ and $A_2$ (either $A_1$ or $A_2$=1; $A_1 \neq A_2$), we will notice that as soon as $A_1$ or $A_2$ is defined, the other one will be defined too, but if neither is defined then neither may take the value of 1 or 0. This means that both $A_1$ and $A_2$ must remain at an indefinite state that is not 1 or 0. Such a state must be a state that can be considered as a superimposition of the states 1 and 0. This state will not output 1 or 0 value, but will accept those values as input and consequently set itself to this input value and will thereafter resolve the remaining input/output values according to the given rule.

FIG. 3A illustrates logical entanglement in the context of a simple example of deduction by exclusion. This hypothetical example involves two boys, Tim and Tom. We know that the one of the boys is six years old and the other one is nine years old. We can now devise a circuit along this invention. Let the logical 0 correspond to age 6 and the logical 1 to age 9. A circuit element according to the invention for handling the logical entanglement is shown in FIG. 3. Let the bi-directional terminal $A_1$ correspond to "Tim" and the bi-directional terminal $A_2$ correspond to "Tom". The entanglement rules will specify that if $A_1$=1 then $A_2$=0, and if $A_2$=1 then $A_1$=0. In other words, if Tim is 9, then the possibility that Tom were also 9 is excluded; therefore Tom must be 6. Likewise, if Tom is 9, then Tim must be 6. It can be seen that without any additional information the case is unresolved and the terminals $A_1$ and $A_2$ must be in the indefinite state $\phi$. When auxiliary information like "Tom is 9" is inserted to the circuit ($A_2$=1) then the ambiguity will be resolved and $A_1$ will be forced to 0 (Tim is 6) by the entanglement rules. This simple example involves only one entanglement rule set, and therefore no B inputs are required.

Here this example is described in more detail. There is a bi-directional entanglement rule between the A1 and A2 terminals:

if A1=$\phi$ (an indefinite state) then the state of A2 is not affected

If A1=0 then A2=1 if A1=1 then A2=0 if A2=$\phi$ (indefinite state) then the state of A1 is not affected if A2=0 then A1=1 if A2=1 then A1=0

FIG. 3B shows an example of a physical circuit for implementing the logical entanglement shown in FIG. 3A.

The comparators Comp1, Comp2 and the OR-gate OR1 form a window detector 31. The output of the window detector 31 (the output of OR-gate OR1) is at logical zero (0 V) whenever the input A1 is at indefinite state and at logical one (5 V) whenever the input A1 is at logical zero or one. The window detector 31 has a high input impedance, (10 MΩ in this example), since the input impedance of the comparators is very high, and the only other contributing circuit element, the three-state gate TRI-S2 is at a high-impedance state. The window detector 31 accepts a very high impedance source, open circuit and 2.5 V voltage as the indefinite state input. When a logical one (input voltage>3.33 V) or zero (input voltage<1.66 V) input is detected, the window detector's output will be at logical one and this will propagate through the gate AND1 to enable the three-state gate TRI-S1 which will then pass the inverted (by inverter INV3) A1 input as its output to the terminal A2, which will now act as a low-impedance (5 kΩ) output terminal. Normally the TRI-S1 gate output is at a high-impedance state and does not contribute to the state of A2. The logical one signal from the gate AND1 is also inverted by INV1 and forwarded to AND2. The output of AND2 will now become zero and the TRI-S2 gate output will remain at high impedance state. Thus the inverting signal path from A2 to A1 is cut off while the inverting signal path from A1 to A2 is enabled. The 5 kΩ resistors at A1 and A2 serve as current limiting devices in case a possible input logic state contests a possible output logic state.

When a logical signal is connected to the A2 input instead of A1, the operation is the mirror image of the previous description, and the inverting signal path from A2 to A1 is enabled. Thus it can be seen that this circuit implements the bi-directional entanglement rule between two bi-directional terminals.

The circuit shown in FIG. 3B also operates without the components AND1, INV1, AND2 and INV2. In that case the control signal to TRI-S1 is taken directly from the output of OR1 and the control signal to TRI-S2 is taken directly from the output of OR2. In this case the logical paths from A1 to A2 and from A2 to A1 will be enabled simultaneously. There will be no logical contradiction, but the adopted logical sate will remain locked until the power is switched off.

It is self-evident that the circuit shown in FIG. 3B is only a representative realization of the bi-directional entanglement rule and that the component and voltage values are approximate. Many other realizations are possible within the basic principle of this invention.

Next the invention will be described in the context of reverse computation of functions. Certain mathematical functions are easy to compute in one direction, but difficult and time consuming in the reverse direction. An example of these computations is the factoring of large integers. A product of two large integers can be easily computed, but if the product is given, then finding the factors is extremely time-consuming with any of the algorithms generally known today.

According to common practice the forward computation of a function can be realized by a network of logic elements. When input numbers are inserted, signal paths emerge and converge at the correct output. A hypothetical reverse computation would involve the activation of these signal paths in reverse order so that the given result would evoke signal paths that would converge at the desired input values. Usually this reverse activation will not lead to unequivocal signal paths, however. Indefinite states will occur here and there; these states can be considered as the superimposition of logical one and zero. However, this superimposition can be made to collapse due to the constrictions given by the overall computation; in that case the logical nodes would be entangled according to the rules of computation. In other cases some superimposed nodes could be forced into one or the other state; in that case the rest of the network nodes would collapse due to the entanglement rules. In this way the network could be made to execute the computation in reversed order. However, this kind of reverse computation is not possible with existing logic elements as these do not communicate any information at their output nodes back to their input nodes. Also they do not contain the necessary superimposed states. Accordingly, one aspect of this invention is the logic circuitry that enables this kind of reverse computation of logic functions.

Conventional logic circuits include the elements NOT (logical inversion), AND, OR, NOT-AND ("NAND"), NOT-OR ("NOR"), EXCLUSIVE-OR ("XOR"), etc. A NOT element has only one input, while the others have multiple inputs. The operation of each of these elements is defined by a truth table that gives an unequivocal output for each combination of inputs. At any point of time, each input or output may have only one of two values, either "true" ("1") or "false" ("0"). The construction of a reverse logic circuit would involve the realization of its truth table in reversed order.

FIG. 4 shows a NOT element 41 and its truth table 45. There is no ambiguity here. If the output 43 is "1" then the input 42 must be "0" and vice versa. Thus a reverse NOT circuit is the NOT circuit itself, the element must be simply reversed.

Figure 5:
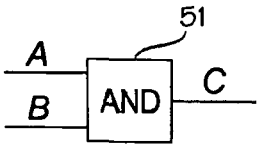
FIG. 5 shows an AND circuit and its truth table.
Figure 6:
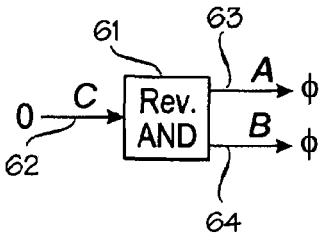
FIG. 6 shows a reverse AND element 61 and its associated truth table 65.

FIG. 5 shows a truth table 55 for an AND circuit 51. FIG. 6 shows a reverse AND element 61 and its associated truth table 65. We can see that whenever C=1, there is no ambiguity, and both A and B must have the value of "1". However, whenever C=0, A and B may have the values of 0 and 1. These values are superimposed on each other and this superimposition cannot be resolved without additional information. However, we can further see that in this superimposition A and B are entangled by an exclusion rule 66: if A=1 then B=0; if B=1 then A=0.

If the input C 62 of the reverse AND element 61 is set to "0", the outputs A and B, 63 and 64, will have ones and zeros superimposed, as depicted by the "φ" symbols. This superimposition will collapse if one of the outputs A and B is forced to logical one. This kind of collapse can take place in networks consisting of interconnected logic elements.

It is well known that a NAND gate, which can be created from an inverter (NOT element) plus an AND gate, is a logically complete element, since any logical operation can be realized by various combinations of NAND gates. For practical circuits, however, some combinatory circuits will be considered directly. In the following two basic binary summing circuits will be considered.

Figure 7:
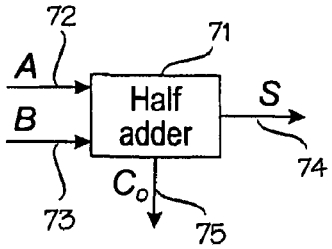
FIG. 7 shows a half adder.

FIG. 7 shows a half adder 71 that that adds two binary digits, A 72 and B 73 and outputs their sum S 74 plus a carry output $C_O$ 75. Reference sign 76 denotes the associated truth table.

Figure 8:
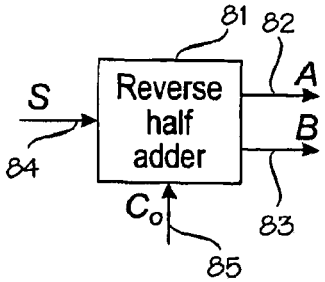
FIG. 8 shows a reverse half adder.

FIG. 8 shows a reverse half adder 81 whose outputs are two binary digits, A 82 and B 83. The inputs are a sum S 84 and a carry $C_O$ 85. The carry input $C_O$ 85 has the suffix "O" (for "output") because this input accepts a carry output of an adder circuit. Reference sign 87 denotes the associated truth table.

It can be seen that a condition S=1 and $C_O$=1 does not exist. Furthermore, there is a set 88 of two unequivocal conditions:

If S=0 and $C_O$=0 then A=B=0;

If S=0 and $C_O$=1 then A=B=1.

The only superimposed condition occurs when S=1 and $C_O$=0. In that case A and B are entangled. The superimposed condition is denoted by reference sign 89, as follows:

If S=1 and $C_O$=0 then

If A=1 then B=0;

If B=1 then A=0.

Figure 9:
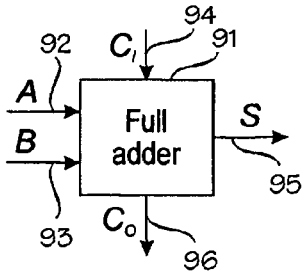
FIG. 9 shows a full adder.

FIG. 9 shows a full adder 91 that that adds two binary digits, A 92 and B 93, plus a carry input $C_1$ 94, and outputs their sum S 95 plus a carry output $C_O$ 96. Reference sign 97 denotes the associated truth table.

Figure 10:
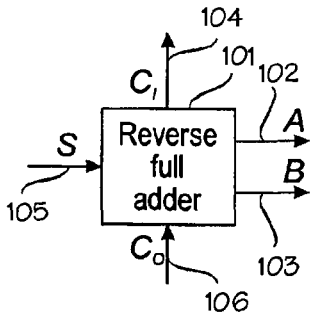
FIG. 10 shows a reverse full adder.

FIG. 10 shows a reverse full adder 101 whose outputs are two binary digits, A 102 and B 103, plus a carry input $C_1$ 104. The inputs are a sum S 105 and a carry out $C_O$ 106. Again, the carry in and out suffixes appear reversed because the element 101 is a reverse full adder. Reference sign 107 denotes the associated truth table. Reference sign 108 denotes a set of unequivocal conditions, and reference sign 109 denotes a set of entanglement rules for the superimposed conditions:

S=1 and $C_O$=0; or

S=0 and $C_O$=1.

Working Example: a Reverse Multiplier

In the following, a practical implementation of a reverse multiplier will be described. The reverse multiplier of this example is simple enough that its operation can be figured out by pen and paper using the rules for reverse logic elements that were presented earlier. Alternatively a computer program can be devised for this purpose. Moreover actual electronic circuits can be designed for the logic elements and thereafter an ordinary circuit simulation program can be used to simulate the operation of the network if the network is a small one. Larger networks can be simulated, but the simulation time will eventually be prohibitive whereas an actual electronic circuit will deliver the result instantly.

Let us consider the multiplication of a three-bit binary number by a two-bit binary number. The binary numbers to be multiplied are $[a_2\ a_1\ a_0]$ and $[b_1\ b_0]$ wherein $a_0$ and $b_0$ are the least significant digits. The intermediate steps of the multiplication are shown in FIG. 11.

The carry digits are marked as $c_0$, $c_1$ and $c_2$. The binary product is $[p_4\ p_3\ p_2\ p_1\ p_0]$ where $p_0$ is the least significant digit. Here the digit-by-digit multiplication is followed by addition.

Binary digit multiplication can be performed by the AND Operation. The addition can be performed by the half adders and full adders that were described earlier.

Figures 11, 12:
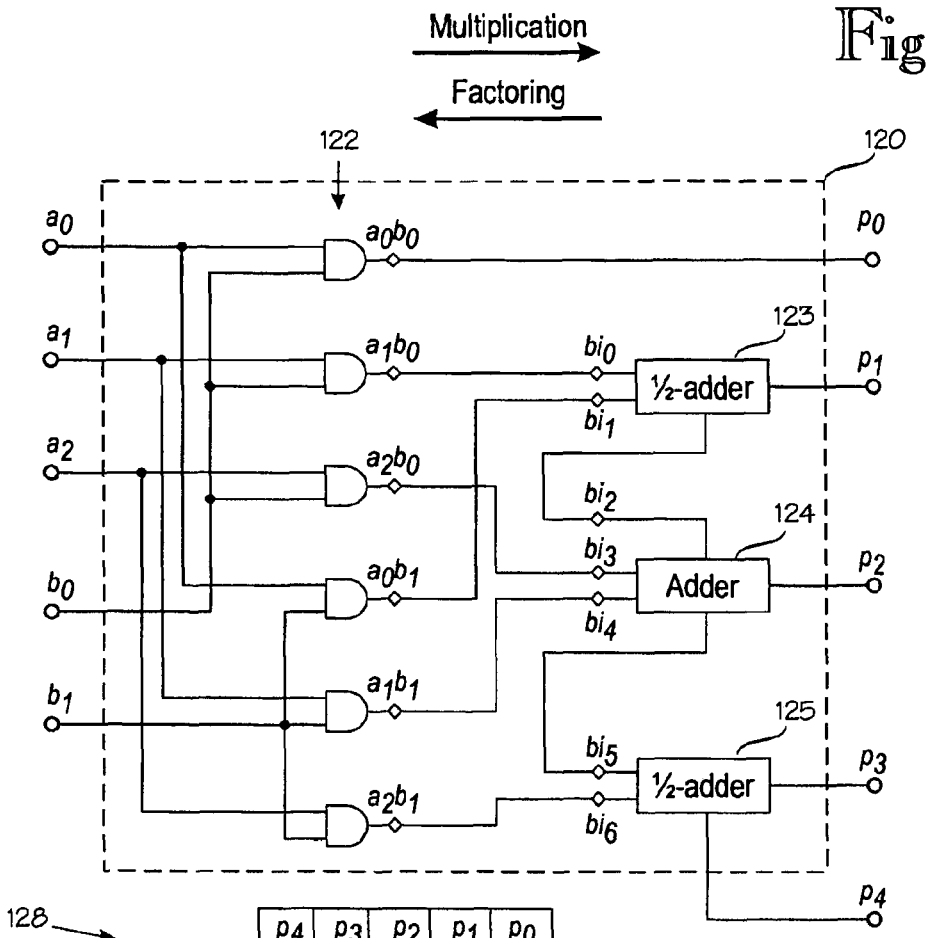
FIG. 11 shows a multiplication example.
FIG. 12 shows a hard-wired logic network for performing the multiplication example shown in FIG. 11.

FIG. 12 shows a hard-wired logic network 120 for performing the multiplication shown in FIG. 11. The input and output terminals $a_0$-$a_2$, $b_0$-$b_1$ and $p_0$-$p_4$ correspond to the numerical quantities described in connection with FIG. 11. The circuit comprises six AND gates 122, two half adders 123, 125, and one full adder 124. The network 120 is also operational in the reverse calculation if the logic elements, ie, the AND gates and the adders 123-125, are replaced by their reverse variants.

For demonstration purposes, the network 120 was simulated with a circuit simulator. For example, Electronics Workbench by Interactive Image Technologies, Toronto, Canada, is an example of suitable circuit simulators. The largest number that can be handled with this network is 7×3=21 or in binary notation 111×11=10101. In order to test the network this number 10101 was set as the product to be factored. The network yielded correctly factors 111 and 11. It can be seen that this is kind of a trivial case as there is no ambiguity in the network, FIG. 9.

However, in a general case one or more of the nodes marked $bi_0$ to $bi_6$ will remain in a superimposed state, and the network 120 will not settle towards a solution. Due to the symmetry of the possibilities, the network cannot decide between possible signal paths. Therefore the superimposition must be made to collapse by the introduction of slight asymmetry. This can be achieved by feeding appropriate bias signals into the nodes $bi_0$ to $bi_6$, in such a way that the nodes are drawn towards a logical one or zero. The bias must be made weak, for example, by feeding it via a high-impedance element, such that the circuit can override it if contested by other signals.

For example, the network 120 is not able to factor $01010_2$ (decimal 10) but will remain in a superimposed state. But in response to an appropriate bias (a weak logical one to nodes $bi_1$, $bi_4$ and $bi_6$), the network 120 settles towards $[a_2\ a_1\ a_0]=101_2$ (decimal 5) and $[b_1\ b_0]=10_2$ (decimal 2), which is the correct result. Reference sign 128 denotes a set of input and output bit combinations, as well as the bias applied to the nodes $bi_0$ to $bi_6$ and the actual state of the network at these nodes. It will be seen that the network 120 overrides the weak bias applied to node $bi_4$.

FIG. 13 shows a table 130 that enumerates the results of factoring all numbers up to 21 in a circuit as shown in FIG. 12, with a weak logical one bias applied to nodes $bi_1$, $bi_4$ and $bi_6$). An entry of "Ok" in the comment column indicates a correct result. Some input binary numbers, namely decimal values 11 (1×11), 13 (1×13), 16 (2×8 or 4×4), 17 (1×17), 19 (1×19) and 20 (2×10 or 4×5) cannot be represented within the network 120 as a product of two numbers, because one of the possible factors is greater than what can be accommodated. Hence these cases are marked here "overflow" in the comment column. It can be seen that a given set of bias signals will not lead to correct results for every input product value. Therefore the outcome should be checked by multiplying the resulting $[a_2\ a_1\ a_0]$ and $[b_1\ b_0]$ factors, and a different set of bias signals should be applied, as shown in FIG. 14.

Figure 14:
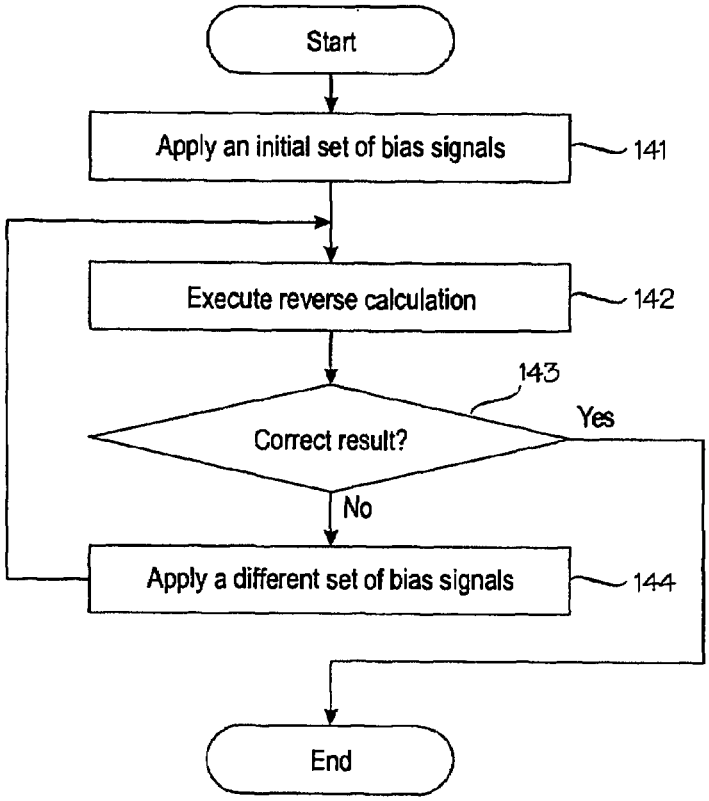
FIG. 14 shows a procedure for factoring a multi-bit input binary number.

FIG. 14 shows a complete procedure for factoring a multi-bit input binary number $[p_{n-1} \ldots p_0]$ with a network constructed along the principles described above. In step 141 an initial set of bias signals is applied. In step 142 the input binary number $[p_{n-1} \ldots p_0]$ is factored into a and b factors by reverse calculations. In step 143 the correctness of the result is checked. For example, the resulting a and b factors can by multiplied and checked if the multiplication produces the original input binary number $[p_{n-1} \ldots p_0]$. If not, a different set of bias signals is applied in step 144, and the process is repeated.

A given number may be a product of multiple set of factors. For instance, 16=2×8 or 4×4. Certain bias signals will give one possibility, other bias signals will reveal other possibilities. An integer P, that is the product of two prime numbers A and B, leads to the possibilities 1×P, P×1, A×B and B×A only, and is easier to factorize by the technique according to the invention because there are only small number of possible reverse logic paths.

It is apparent that larger reverse multipliers can be designed along these lines. The exemplary network 120 is described only as a simple illustration of the principles of the invention. It is also apparent that the technique according to the invention is not limited to factorization but can be used to other types of calculations involving reverse computing, provided that the logical reverse computing network is set up appropriately for each specific case.

Hardware Realizations for Reverse Logic Elements

In the above description the reverse logic elements have been shown as "black boxes" in the sense that their internal construction has not been discussed yet. In the following, we will discuss hardware realizations for a logically complete family of logic elements.

As stated above, a key concept of the invention is a superimposition of logical one (true) and zero (false) states. The superimposition of states persists until caused to collapse by means of further information as determined by one or more sets of entanglement rules.

According to an aspect of the invention, the superimposition of states is realized by means of logic elements having a high-impedance state in addition to the conventional states of logical zero or one. In the high-impedance state, the logic element neither supplies nor draws any significant amount of current via its bi-directional terminals. Thus the high-impedance state can be utilized to accept logical states and bias information from external sources (see FIGS. 12 to 14 with their accompanying description). An electronic realization of the high-impedance state can be achieved by means of backward-biased diodes, field effect transistors (FET) held off-state, or 3-state logic elements, or any combination of these, for example.

The entanglement rules that that specify the allowable bit patterns at the input or output nodes of the circuit can be realized by conventional cross-connected combinatory logic.

As an alternative to a physical realization of such circuits, the circuits can be simulated by computer software.

Figure 15:
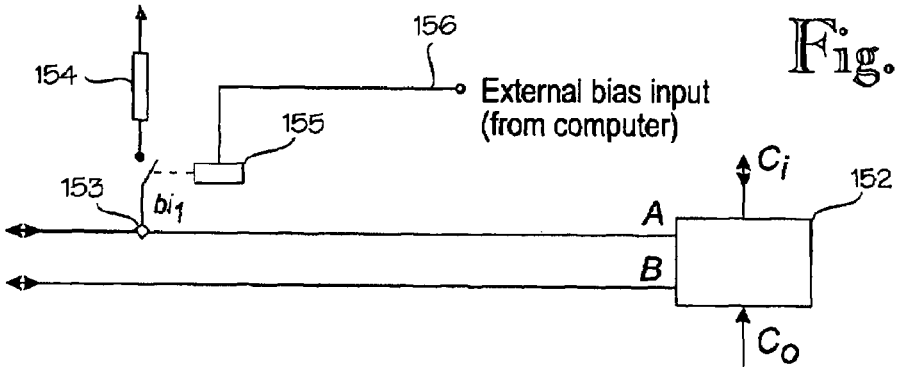
FIG. 15 shows a biasing arrangement.

FIG. 15 shows one example of biasing arrangement. The arrangement comprises an entangled logic device 152, such as the reverse full adder 124 of FIG. 10. When the S input=1 and the $C_o$ input=0, the bi-directional terminals A, B and $C_i$ are in the indefinite state, as the information from the S and $C_o$ inputs is not sufficient to resolve the case. However, the states of A, B and $C_i$ are bound by the entanglement rule, which specifies that only one of these inputs may assume the value 1, while the others must then assume the value 0. In order to resolve the indefinite state, a bias may be introduced to one of the terminals A, B and $C_o$. In FIG. 15 this bias is connected to the terminal A via a current limiting device 154 such as a resistor. This sets the value of the bi-directional terminal A to logical 1, causing the other terminals B and $C_i$ to assume the value 0. Thus the indefinite state is resolved. However, the bias represents only a guess about the proper state of the terminals A, B and $C_i$. In actual networks these terminals may be connected to bi-directional terminals of other devices. These devices may have all the information to resolve the states of their terminals and these states are then communicated to the terminals of the original device 152. This outside information must therefore override the bias setting should these be in conflict. This will take place if the bias is weak, for instance is in the form of weak current that can be overridden by the current sink and source capacity of the connected terminal. Also the bias must be weak enough so that the device 152 itself can override it when, for instance, $S=C_o=0$ and hence A, B and $C_i$ must be 0.

In practical applications the bias settings can be variable. In the arrangement shown in FIG. 15, an electronic switch 155 permits the control of the bias input $bi_1$ by an external input 156 from an external controller, such as a data processing system (not shown separately).

Figure 16:
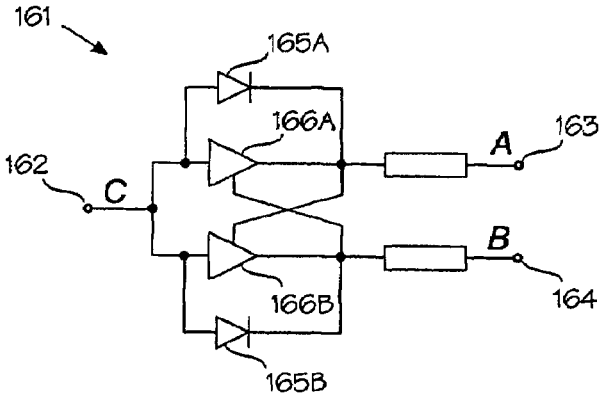
FIG. 16 shows a hardware realization of a reverse-AND element.

FIG. 16 shows a hardware realization 161 of a reverse-AND element, which was shown as a "black box" in FIG. 6. Terminal 162 is the C terminal, ie, the input of the reverse-AND element. Reference signs 163 and 164 denote the A and B outputs, respectively.

For instance, if the circuits shown in FIGS. 12 and 16 to 18 are simulated by a circuit simulator, the gates should be of the High speed CMOS variety or ideal models with a high input impedance, in which case resistor values of a few kΩ are suitable. Conventional transistor-to-transistor (TTL) logic gates are not suitable.

Up to this point in the description of the invention, the true (=one) and false (=zero) states of logical circuits have been free of any connections to any physical quantity, such as voltage, current of electric charge. But in the description of a hardware realization, a connection to some physical quantity must be made, and from now on, the convention to be used is that a high voltage means a logical one and a low voltage means a logical zero, but this convention is not meant to restrict the scope of the invention, and the circuits could be redesigned such that the convention is reversed.

When a logical one, ie a high voltage, is applied to the reverse C input 162, the reverse A and B outputs 163 and 164 will be set to logical one via the two diodes 165 and 166. Thus the logical AND rule 1×1=1 is realized in the reverse direction. Now three rules remain; 1×0=0, 0×1=0 and 0×0=0. It can be seen that when the reverse C input 162 is set to zero, the reverse A and B outputs 163, 164 may have the logical value zero or one and only one of the reverse outputs may have the logical value one. Thus an input value of zero at the reverse C input 162 must not force the reverse A and B outputs 163, 164 to one or zero. Instead, both values (one and zero) must be allowed simultaneously; thus the superimposed state is needed. This is provided by the high reverse impedance of the two diodes 165A and 165B and the high-impedance outputs states of the 3-state gates. However, if one of the reverse outputs 163, 164 is externally forced to logical one, then the other output must be forced to zero, because 0×1=0 or 1×0=0. An entanglement rule is needed here that does this. This rule is implemented here by the two cross-connected 3-state logic gates 166A and 166B. If, for example, the reverse A output 163 is forced to logical one, then the 3-state logic gate 166B of the reverse B output is set to conducting state and the logical zero at the reverse C input 162 is transmitted to the reverse B output 164. Thus the required entanglement rule is implemented. It is obvious that other circuit implementations exist that realize the required superimposition and entanglement rules within the framework of this invention.

As stated above, in connection with 4, a reverse NOT element is the NOT element itself with the input and output terminals swapped. As is well known, AND elements and NOT elements can be combined in various ways to implement any logical circuit, and the same is true for their reverse variants, and the above description can be considered enabling, at least theoretically. For practical purposes, however, it is beneficial to consider some more complex circuits directly.

Figure 17:
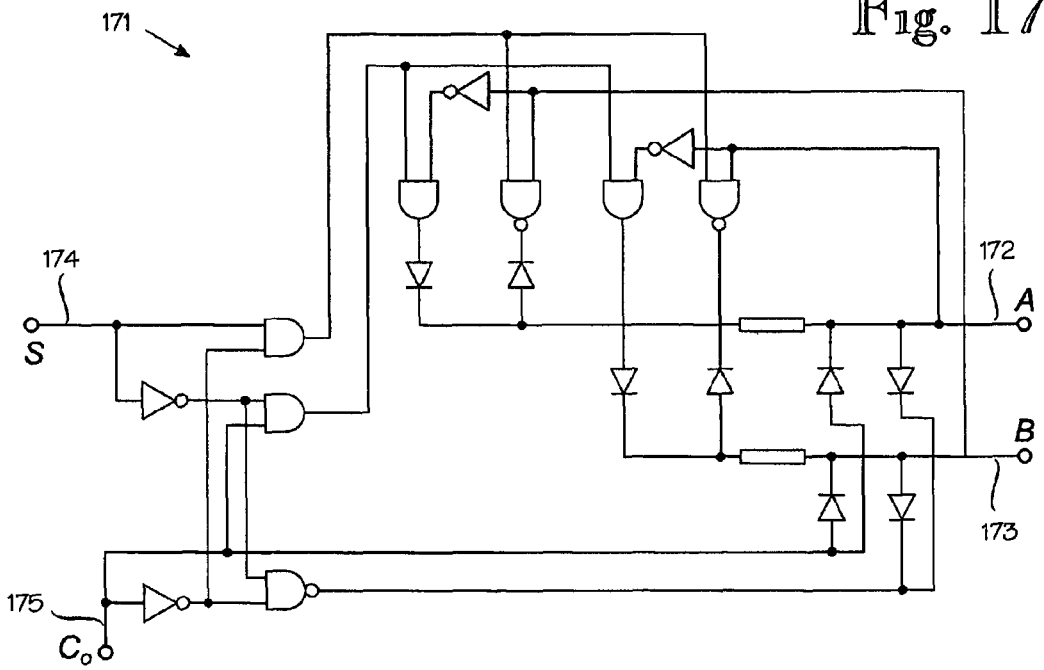
FIG. 17 shows an exemplary physical realization of a reverse half adder.

FIG. 17 shows an exemplary physical realization 171 of a reverse half adder that was discussed as a logical element in connection with FIG. 8. In the reverse operation, the inputs of the circuit 171 are a sum S 174 and carry out $C_O$ 175. The outputs are A 172 and B 173.

Figure 18:
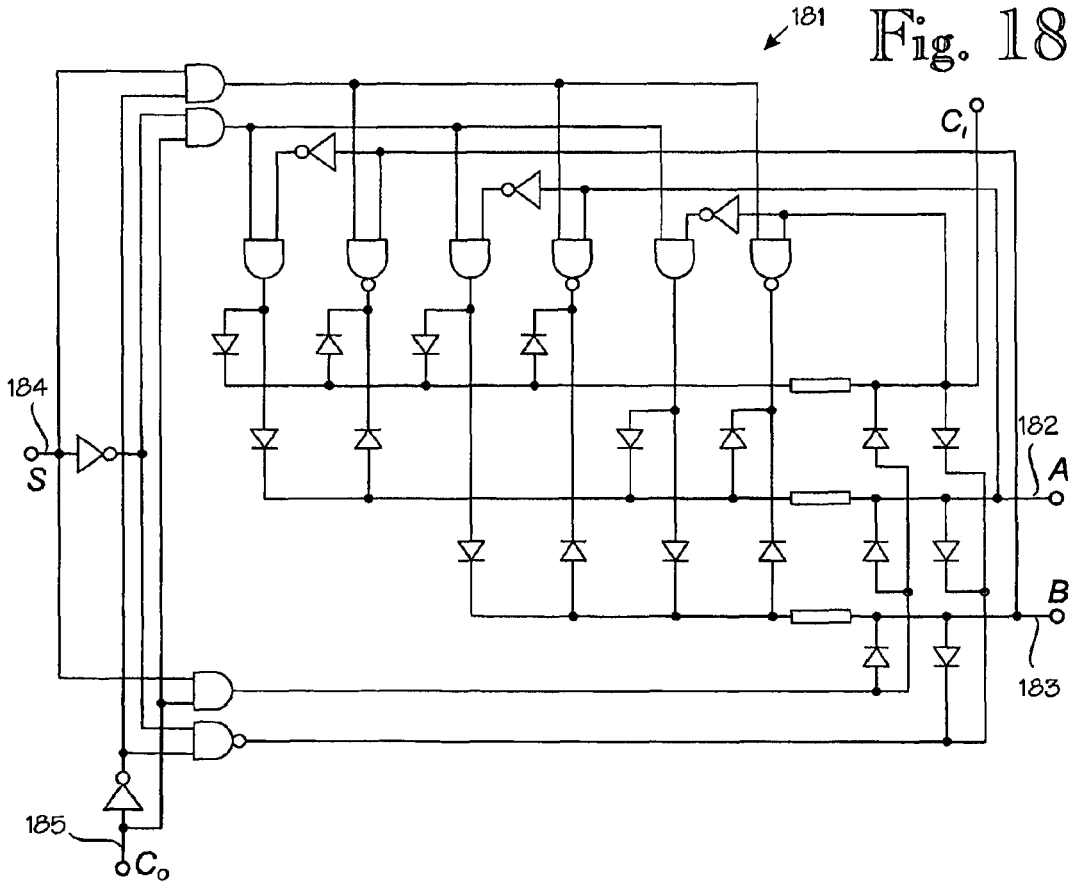
FIG. 18 shows a physical realization of a reverse half adder.

FIG. 18 shows a physical realization 181 of a reverse half adder that was discussed as a logical element in connection with FIG, 10. In the reverse operation, the outputs are two binary digits, A 182 and B 183, plus a carry input $C_I$184. The inputs are a sum S 185 and a carry out $C_O$ 186. Again, the carry in and out suffixes appear reversed because the circuit 181 is a reverse full adder.

It is readily apparent to a person skilled in the art that, as the technology advances, the inventive concept can be implemented in various ways. Hardware realizations of the embodiments of the invention have been described in the context of electronic circuits in which a high voltage means logical true and a low voltage means logical false, but this is only a non-restricting example. The invention and its embodiments are not limited to the examples described above but may vary within the scope of the claims.

I claim:

1. A circuit element comprising:

two or more logically entangled bi-directional terminals, wherein each bi-directional terminal can assume any one of three logical states, which are:

(a) a logical true state;

(b) a logical false state; and (c) an indefinite state, in which state the bi-directional terminal accepts one of the logical true and logical false states as an external input from an external source; and an entanglement logic for resolving the logical state of each of the bi-directional terminals according to a predetermined set of logical entanglement rules between the bi-directional terminals, *wherein the logical state of one of the two or more logically entangled bi-directional terminals is dependent on the logical state of another of the two or more logically entangled bi-directional terminals*.

2. A circuit element according to claim 1, wherein the entanglement logic is operable to perform said resolving in response to the external input from the external source.

3. A circuit element according to claim 1, wherein the circuit element comprises several sets of logical entanglement rules and a set of additional terminals, each additional terminal accepting a logical true state or logical false state as an input, wherein the inputs to the set of additional terminals collectively determine which of several sets of logical entanglement rules are to be used for said resolving.

4. A circuit element according to claim [1] *3*, wherein the inputs to the set of additional terminals collectively determine the logical state of one or more of the bi-directional terminals.

5. A circuit element according to claim 1, further comprising one or more circuit components, each of which has a high-impedance state, for implementing said indefinite state.

6. A [computer program product including program instructions, wherein the program instructions cause a computer to simulate the circuit element according to claim 1, when said computer program product is run on said computer] *non-transitory computer-readable storage device having instructions stored thereon, the instructions comprising:*

*instructions to accept one of a logical true state and a logical false state as an input from an external source at one of two or more logically entangled bi-directional terminals; and*

*instructions to resolve a logical state of each of the two or more logically entangled bi-directional terminals according to a predetermined set of logical entanglement rules between the two or more logically entangled bi-directional terminals, wherein the logical state of one of the two or more logically entangled bi-directional terminals is dependent on the logical state of another of the two or more logically entangled bi-directional terminals*.

7. A network for logical deduction, the network comprising:

two or more circuit elements, each of which comprises:

two or more logically entangled bi-directional terminals, wherein each bi-directional terminal can assume any one of three logical states, which are:

(a) a logical true state;

(b) a logical false state; and (c) an indefinite state, in which state the bi-directional terminal accepts one of the logical true and logical false states as an external input from an external source; and an entanglement logic for resolving the logical state of each of the bi-directional terminals according to a predetermined set of logical entanglement rules between the bi-directional terminals;

wherein the network further comprises a set of additional terminals, each additional terminal accepting a logical true state or logical false state as an input, wherein the inputs to the set of additional terminals collectively determine which of several sets of logical entanglement rules are to be used for said resolving.

8. A network according to claim 7, further comprising an operational coupling of each of several bi-directional terminals of one or more logic elements to one or more additional terminals of another circuit terminal.

9. A network according to claim 8, wherein said operational coupling is modifiable by the external input.

10. A network according to claim 7, wherein each of several bi-directional terminals of one or more logic elements is operationally coupled to one or more bi-directional terminals of another circuit terminal.

11. A network according to claim 7, further comprising an interface to a data processing system for controlling and accessing some or all of the bi-directional terminals.

12. A network according to claim 7, wherein the entanglement logic comprises bias elements for biasing one or more nodes of the network towards one of the logical states, wherein each bias element is weak enough to be overridden by one of the circuit elements.

13. A network according to claim 12, wherein the bias elements are responsive to external input from a data processing system.

14. A network according to claim 12, further comprising a data processing system for entering random or pseudorandom values to the bias elements.

15. A network according to claim 12, further comprising a data processing system that comprises:

a first routine for entering a set of bias values to the bias elements;

a second routine for verifying an output provided by the network under the set of bias values; and a third routine for modifying the set of bias values and for re-executing the first and second routines until the second routine positively verifies the output.

16. A [computer program product including program instructions, wherein the program instructions cause a computer to simulate the network according to claim 7, when said computer program product is run on said computer] *non-transitory computer-readable storage device having instructions stored thereon, the instructions comprising:*

*instructions to accept one of a logical true state and a logical false state as an input from an external source at one of two or more logically entangled bi-directional terminals; and*

*instructions to resolve a logical state of each of the two or more logically entangled bi-directional terminals according to a predetermined set of logical entanglement rules between the two or more logically entangled bi-directional terminals; and*

*instructions to accept one of a second logical true state or a second logical false state as an input at each terminal of a set of additional terminals, wherein the inputs to the set of additional terminals collectively determine which of several sets of logical entanglement rules are to be used to resolve the logical state*.

*17. A method comprising:*

*accepting one of a logical true state and a logical false state as an input from an external source at one of two or more logically entangled bi-directional terminals; and*

*resolving a logical state of each of the two or more logically entangled bi-directional terminals according to a predetermined set of logical entanglement rules between the two or more logically entangled bi-directional terminals, wherein the logical state of one of the two or more logically entangled bi-directional terminals is dependent on the logical state of another of the two or more logically entangled bi-directional terminals.*

*18. The method of claim 17, further comprising biasing one or more nodes of a network towards one of the logical states.*

*19. The method of claim 18, further comprising entering a set of bias values to bias elements in the network.*

*20. The method of claim 19, further comprising verifying an output provided by the network under the set of bias values.*

*21. The method of claim 20, further comprising modifying the set of bias values until the output is positively verified.*

* * * * *